United States Patent [19]
Bailey et al.

[11] Patent Number: 5,943,594
[45] Date of Patent: Aug. 24, 1999

[54] METHOD FOR EXTENDED ION IMPLANTER SOURCE LIFETIME WITH CONTROL MECHANISM

[75] Inventors: Michael E. Bailey, Northfield; Ronald A. Warren, Essex Junction, both of Vt.

[73] Assignee: International Business Machines Corporation, Armonk, N.Y.

[21] Appl. No.: 08/915,206

[22] Filed: Aug. 20, 1997

Related U.S. Application Data

[63] Continuation-in-part of application No. 08/845,970, Apr. 30, 1997.

[51] Int. Cl.$^6$ .................................................. H01L 21/265
[52] U.S. Cl. .............................. 438/514; 438/17; 438/919
[58] Field of Search .......................... 438/17, 514, 515, 438/516, 517, 919

[56] References Cited

U.S. PATENT DOCUMENTS

| | | | |
|---|---|---|---|
| 4,370,176 | 1/1983 | Bruel | 438/514 |
| 4,714,628 | 12/1987 | Eloy | 438/514 |
| 5,235,451 | 8/1993 | Bryan | 359/88 |
| 5,262,652 | 11/1993 | Bright et al. | 250/492.2 |
| 5,354,698 | 10/1994 | Cathey, Jr. | 438/514 |
| 5,466,942 | 11/1995 | Sakai et al. | 250/492.2 |
| 5,766,695 | 6/1998 | Nguyen et al. | 438/919 |
| 5,817,536 | 10/1998 | Nayak et al. | 438/17 |

*Primary Examiner*—Chandra Chaudhari
*Attorney, Agent, or Firm*—Pollock, Vande Sande & Amernick

[57] ABSTRACT

A method for controlling the implantation of ions into a target. An ion source chamber having a filament for causing evolution of the ions to be implanted is provided. An ion source reactant gas is provided for providing a source of the ion species to be implanted. A counteracting gas is provided to counter the chemical transport from or to the filament depending on the reaction between the ion source gas ions and the filament and to compensate for the reaction. The ion source reactant is introduced into the ion source chamber. Parameters regarding electrical or physical characteristics of the filament are measured. The counteracting gas is introduced based upon the measured parameters, wherein the counteracting gas forms ions to compensate for removal or deposition of material on the filament. The ions to be implanted are extracted from ion source chamber and directed to the target.

23 Claims, 5 Drawing Sheets

Erosion Rate

Sputter Gas Flow/Partial Pressure

Deposition Rate

Halogen-Containing Gas Flow/Partial Pressure

5,943,594

METHOD FOR EXTENDED ION IMPLANTER SOURCE LIFETIME WITH CONTROL MECHANISM

RELATED APPLICATIONS

This application is a continuation-in-part of co-pending U.S. patent application Ser. No. 08/845,970, filed Apr. 30, 1997, for Extended Ion Implanter Source Lifetime, to the same inventors, the entire contents of which is hereby incorporated by reference.

FIELD OF THE INVENTION

The present invention relates to a method for implanting preselected ions into a target. In particular, the present invention pertains to ion implanting preselected ions into a target, resulting in extending the life of an ion implanter source or filament. More particularly, the present invention concerns countering the chemical transport from or to the ion implanter source or filament. Furthermore, the present invention provides a method for controlling the countering of chemical transport from or to the source or filament.

BACKGROUND OF THE INVENTION

In manufacturing semiconductor devices, the semiconductor wafer is modified at various regions by diffusing or implanting positive or negative ions, referred to as dopants, into the body of the semiconductor wafer. The dopants may include materials such as boron, phosphoric, arsenic, antimony and the like. The dopants thereby produce regions having varying conductivity.

Those skilled in the art know of various ion implanters that use several types of ion sources. Ion implanters generate an ion beam of a preselected chemical species by means of a current applied to a filament within an ion source chamber. The ion implanters also include a power supply and ion precursor gas feeds and controls.

A potential between the source chamber, which is positive, and extraction means extracts ions through an aperture in the ion source chamber. Allied acceleration systems, a magnetic analysis stage that separates the desired ion from unwanted ions on the basis of mass/charge and focuses the ion beam, and a post accelerated stage that ensures delivery of the required ions at the required beam current level to the target or substrate wafer to be implanted, complete the system.

The most common type of ion source used commercially is known as a Freeman source. In the Freeman source, the filament, or cathode includes a straight rod passed into an arc chamber whose walls are the anode. The filament or cathode is typically made of tungsten or a tungsten alloy. However, the filament may be made of other materials, such as iridium.

The arc chamber includes an exit aperture, means for feeding in the gaseous precursors for the desired ions, vacuum means, means for heating the cathode to about 2000K up to about 2800K so that it will emit electrons, a magnet for applying a magnetic field parallel to the filament to increase probability of collision for ionized species and a power source connecting the filament to the arc chamber.

The ion implantation process begins with the evolution and extraction of ion species from a source chamber. Both solid sources (with vaporizers) and gaseous sources, such as $BF_3$, $AsH_3$, $PH_3$, $GeH_4$, $SiCl_4$ and $GeF_4$, are used. Typically, these source materials are either fluorides or hydrides.

The source materials are passed over the filament, which is at elevated temperatures. The filament decomposes the source material into the desired ionized species. In other words, the filament ionizes the source material into the compound for implantation, and ions from the remainder of the source material compound. For example, $AsH_3$ decomposes into As, H, and $AsH_x$ species. BF, decomposes into B, $BF_2$, F and other BF compounds.

The decomposition of the source material and the ionized species created by the decomposition can cause problems in the operation of the ion implanters. For example, the F (fluorine) ions produce by the ion implanter may cause a problem etching away tungsten from the source cavity, forming gaseous $WF_6$. The $WF_6$ then diffuses to and decomposes on the surface of the filament. This results in the deposition of metallic tungsten on the hot filament and the liberation of fluorine ions.

The metallic tungsten deposited on the filament causes the filament to increase in cross-sectional area, resulting in decreased filament resistance. By affecting filament resistance, deposition of metallic tungsten on the filament may affect the power input to the ion implanter source. For best results, the power input to the source should remain constant. If the filament resistance decreases, then the filament current must increase to maintain the required constant power. Ultimately the implant power supplies cannot supply sufficient current to maintain this fixed power Gas requirement, and the source must be rebuilt with a new filament.

Tungsten erosion from the filament may result from hydrogen produced by the decomposition of arsine and phosphine. The hydrogen tends to remove tungsten from the filament, which can lead to premature source failure in the form of blown filaments.

In a related problem for non-fluorinated source materials, tungsten sputters off of the filament, decreasing the filament's cross sectional area. The filament will soon be too thin and will break, again resulting in the need to rebuild the source with a new filament. This sputtered-away tungsten also causes a problem in that it will deposit on the surface of the insulators that electrically isolate the various parts of the implant source. This will cause premature insulator failure and again result in the need to rebuild the ion source.

The time spent doing these source changes is a major cost-of-ownership driver for ion implanters. Source change-outs are also one of the largest availability detractors for ion implanters. In some cases, such as if only $GeF_4$ were run on a tool, the source must be replaced every 30 hours. In another case, such as if only $BF_3$ were run on an ion implanter, the source must be changed every 36 to 48 hours. Changing the source takes a significant amount of maintenance labor and can take up to 4–6 hours of tool down-time to complete. Clearly, source changeouts represent a significant drain on money, resources, and manpower.

One of the common methods used to extend source lifetimes is to alternate implant species. For example, a fluorinated source feed material, such as $BF_3$ or $GeF_4$, will be run for 4 hours. Then, a non-fluorinated species, such as $AsH_3$ or $PH_3$, will be run for 4 hours. Next, the tool will be switched back again to the fluorinated source material.

FIG. 2 shows the effects of alternating implant species on the resistance of the filament. As can be seen in FIG. 2, the process utilized includes commencing with an implant species that does not include fluorine. Resistance increases in this situation as tungsten sputters off of the filament.

As shown in FIG. 2, at a certain point, the implant species is switched to a fluorine-containing species. As discussed above, fluorine-containing species result in tungsten being deposited on the filament. Tungsten deposition causes the resistance to decrease.

At a certain point, the resistance will decrease to a low point. At this time, the implant species will be switched back to a non-fluorine-containing species.

According to such a source feed switching regimen, the filament cross-sectional area will increase with the $GeF_4$, then decrease with the $AsH_3$, then increase again with fluorinated source material. The fluorine also helps to improve source life by scavenging sputtered away tungsten and causing it to be redeposited on the filament. This cycling results in increased source lifetime and improves overall implanter throughput.

A problem with the source switching is that it is logistically very complex to execute. There are also many instances where the daily production schedule does not support this optimal cycling sequence, making it impossible or impractical to run these alternating species. For example, there may be a mismatch in As/P versus $BF_3$, or $GeF_4$ work in progress or production requirements. Furthermore, switching between source materials takes time and reduces the amount of time that the tool is available to run production hardware.

SUMMARY OF THE INVENTION

In view of the above, the inventors of the present invention recognized that it would be desirable to provide a process for ion implanting dopants that extends the lifetime of the filament without a concomitant loss in throughput of the ion implanter apparatus. The present invention accomplishes chemically what known processes, such as that described above and the results of which are shown in FIG. 1, now achieve through alternating implant species.

The present invention concerns a process for implanting ions into a semiconductor wafer that improves or extends the life of the filament in the system. Moreover, the process of the present invention provides for improved life of the ion implanter source without a concomitant loss in throughput of the apparatus. Furthermore, the present invention provides a method for controlling a process for improving the life of the ion implanter source.

More particularly, according to preferred aspects, the present invention provides a method for controlling the implantation of ions into a target. The method includes providing an ion source chamber having a filament for causing evolution of the ions to be implanted. An ion source reactant gas is provided for providing a source of the ion species to be implanted. A counteracting gas is provided to counter the chemical transport from or to the filament depending on the reaction between the ion source gas ions and the filament and to compensate for the reaction. The ion source reactant is introduced into the ion source chamber. Parameters regarding electrical characteristics of the filament are measured. The counteracting gas is introduced based upon the measured parameters. The counteracting gas forms ions to compensate for removal or deposition of material on the filament. The ions to be implanted from the ion source chamber are extracted and directed to the target.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

DETAILED DESCRIPTION OF BEST AND VARIOUS MODES FOR CARRYING OUT THE INVENTION

Figure 1:
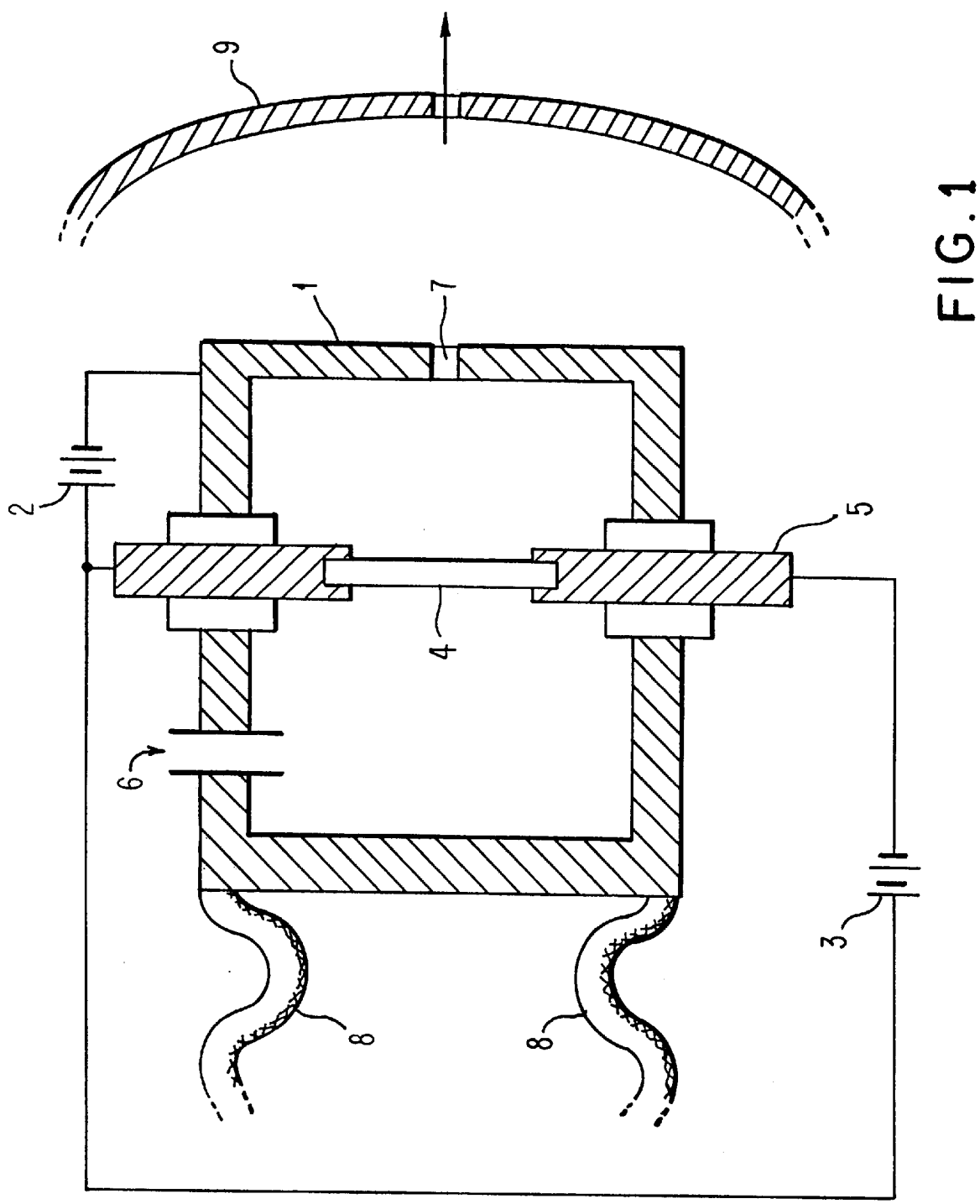
FIG. 1 represents a schematic diagram of apparatus suitable for carrying out the process of the present invention.
Figure 2:
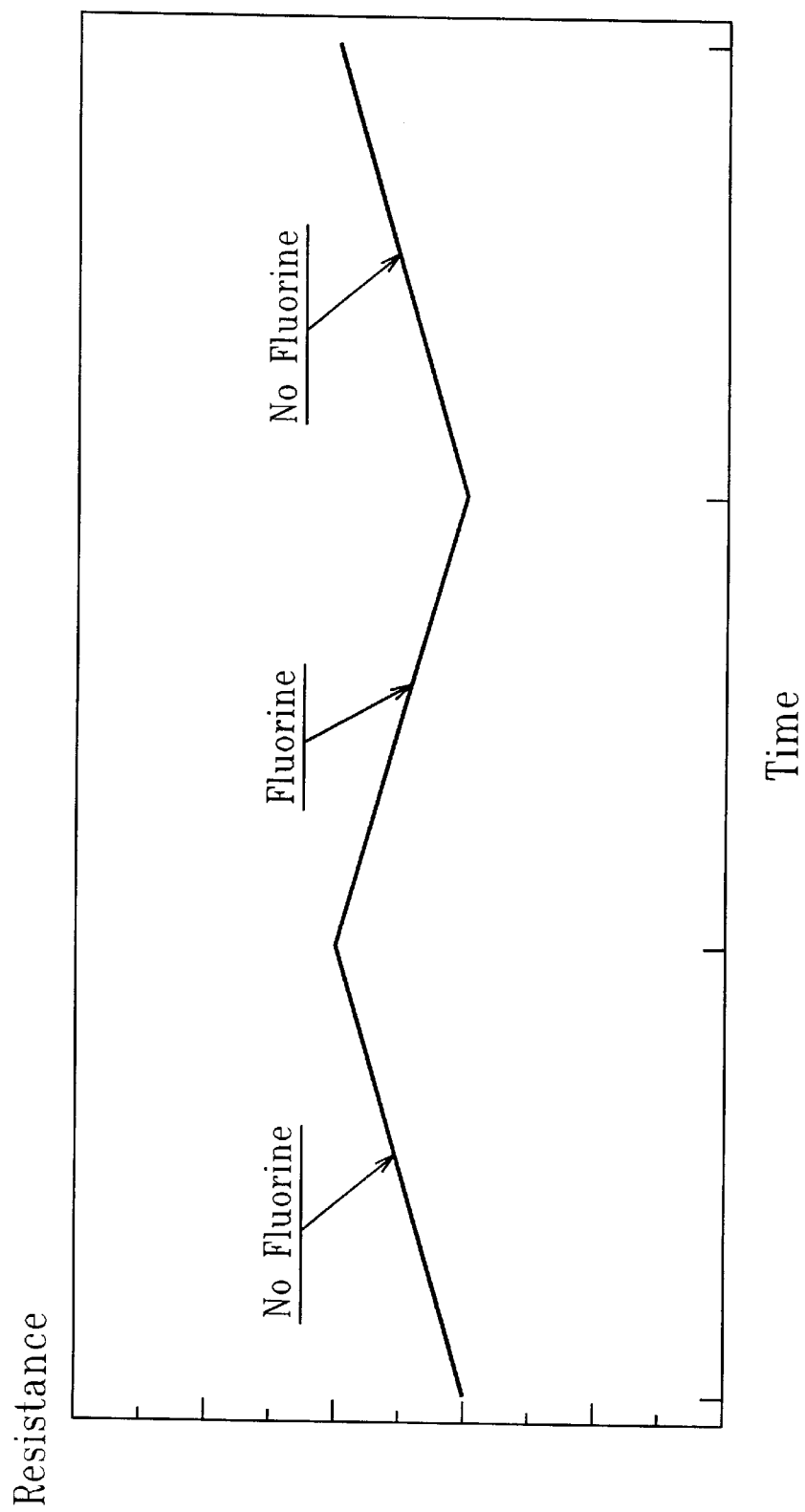
FIG. 2 represents a graph that demonstrates effect on resistance through a filament based upon the known method of alternating species.

The present invention is useful in the operation of ion implanters, such as the example shown in FIG. 1. The ion implanter shown in FIG. 1 includes an ion implant source arc chamber 1. In the operation of the implanter, a source gas is introduced into the source chamber. The gases can be introduced into the source chamber through gas feed 6.

The ion implanter also includes a filament 4. The filament 4 typically is a tungsten-containing filament. For example, the filament may include tungsten or a tungsten alloy containing at least 50% tungsten. The isolation of the filament is represented by 5. A current is applied to the filament to generate ion species. The ion implanter also includes an arc power source 2 and a power source for the filament 3.

The ion implanter shown in FIG. 1 also includes an arc slit 7, isolation bushing 8 and extraction electrode 9. The arrow represents the direction of the ion beam.

According to the present invention, multiple gases or source materials are introduced into the source chamber 1, as shown in FIG. 1. The gases may be introduced into the source chamber at substantially the same time, although, as discussed in greater detail below, one gas may be introduced into the container at certain times, depending upon the operation of the system. The gases may be introduced into the source chamber in controlled relative quantities so as to generate the desired ions to be implanted and to compensate for the removal from or deposition of material on ion implanter source or filament 4.

As discussed above, certain source gases may cause removal of tungsten from the source chamber walls and deposition of tungsten on the filament resulting the above-described problems. Other problems may be associated with other source gases. As summarized above, a counteracting gas or "dummy" source material is introduced along with the primary source material in order to counteract the effect of the primary source material on the filament.

By way of example, when the primary source material is a fluorine containing material, such as $BF_3$, the fluorine ion tends to react with the tungsten source chamber wall forming $WF_6$. This $WF_6$ material is then transported to the filament, where it decomposes and deposits metallic tungsten on the filament. In such a case, either an inert gas such as argon, xenon or krypton, with high sputtering yield or a material containing a chemical species that forms volatile compounds with hot tungsten, such as arsine, phosphine or hydrogen, would be introduced into the source chamber to counteract the filament deposition process.

According to one example, $CHF_3$ is utilized as the counteracting gas. In such a case, both H and F ions would be present in the source chamber and would counteract each others' effects on the filament and possibly other elements of the ion implanter. Simultaneous erosion and deposition of tungsten onto the filament would take place, resulting in little or no net change in filament size.

Figure 3A:
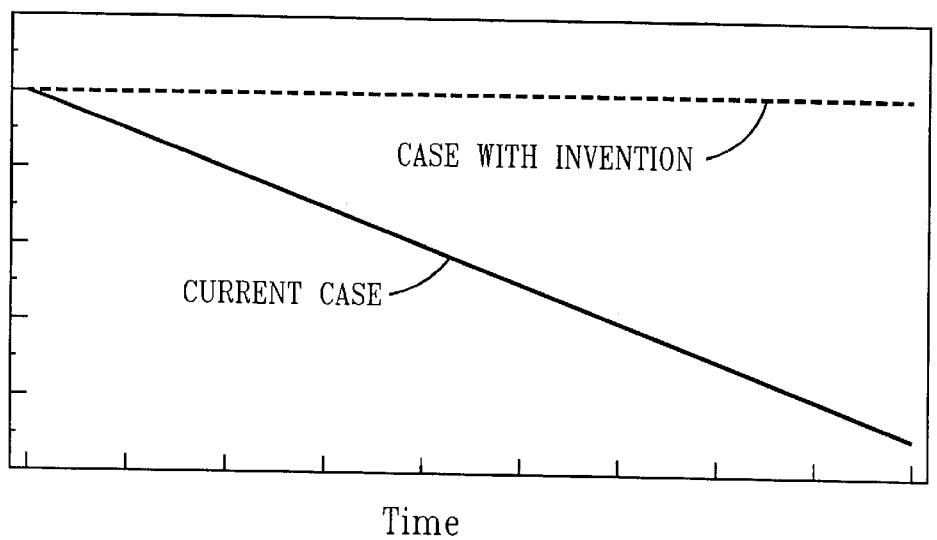
FIGS. 3a, 3b, 3c, and 3d represent graphs that demonstrate changes in resistance, arc/filament/voltage/current, erosion rate, and deposition rate with respect to time, erosion rate, sputter gas flow, and halogen-containing gas flow, respectively.

FIG. 3a shows the effects on filament resistance of implant species according to known processes if no action is taken to address the effects of the implant species. As FIG. 3a shows, resistance will decrease over time. Eventually, the filament will break. On the other hand, the dotted line in FIG. 3a represents the change of resistance with respect to time when utilizing the present invention.

Figure 3B:
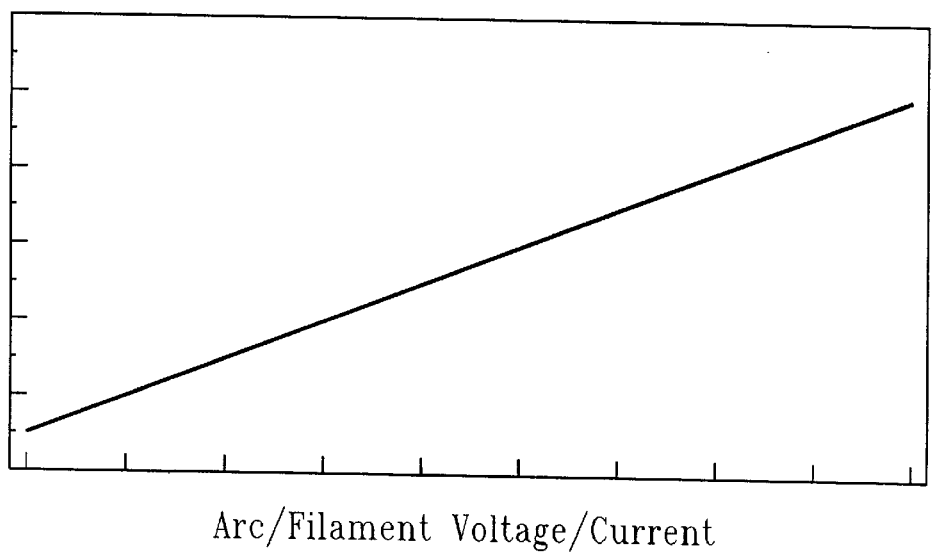

FIG. 3b shows changes in arc current, or filament voltage, as a function of erosion rate. As FIG. 3b shows, erosion of tungsten increases as arc current or filament voltage increases. As discussed herein, the present invention controls erosion rate, thereby controlling the arc current, or filament voltage.

Figure 3C:
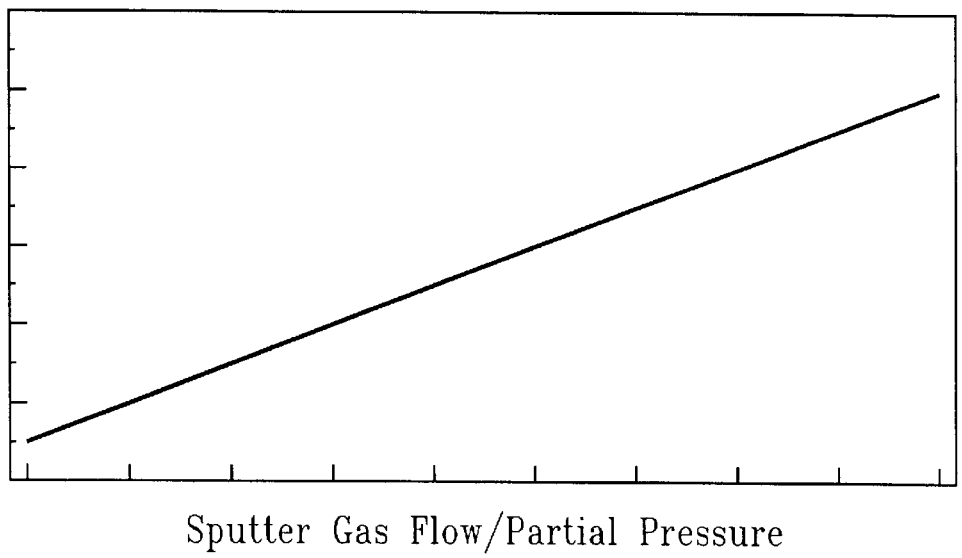
Figure 3D:
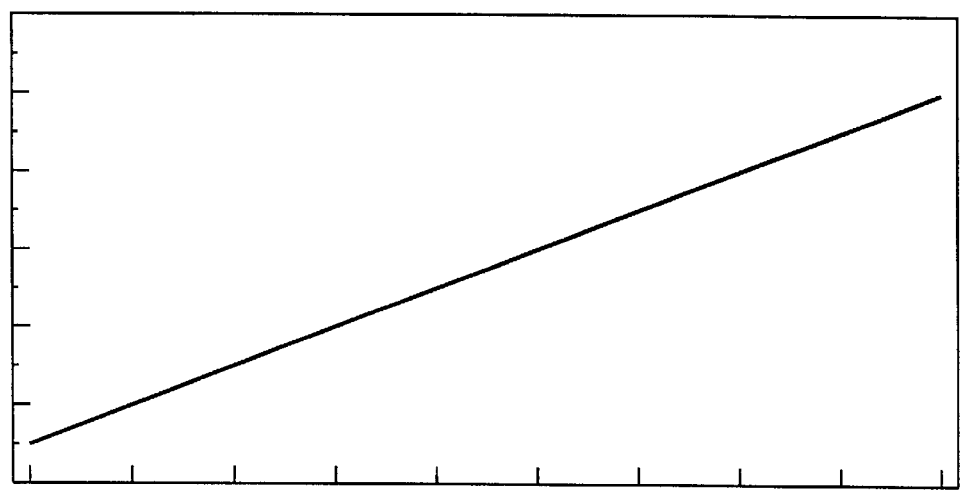

FIG. 3c shows changes in erosion rate with respect to sputter gas flow. As FIG. 3c shows, erosion rate increases as sputter gas flow or partial pressure increases. On the other hand, FIG. 3d shows changes in deposition rate with respect to halogen-containing gas flow. As seen in FIG. 3d, deposition rate will increase as the flow or partial pressure of halogen-containing gas increases.

Figure 4:
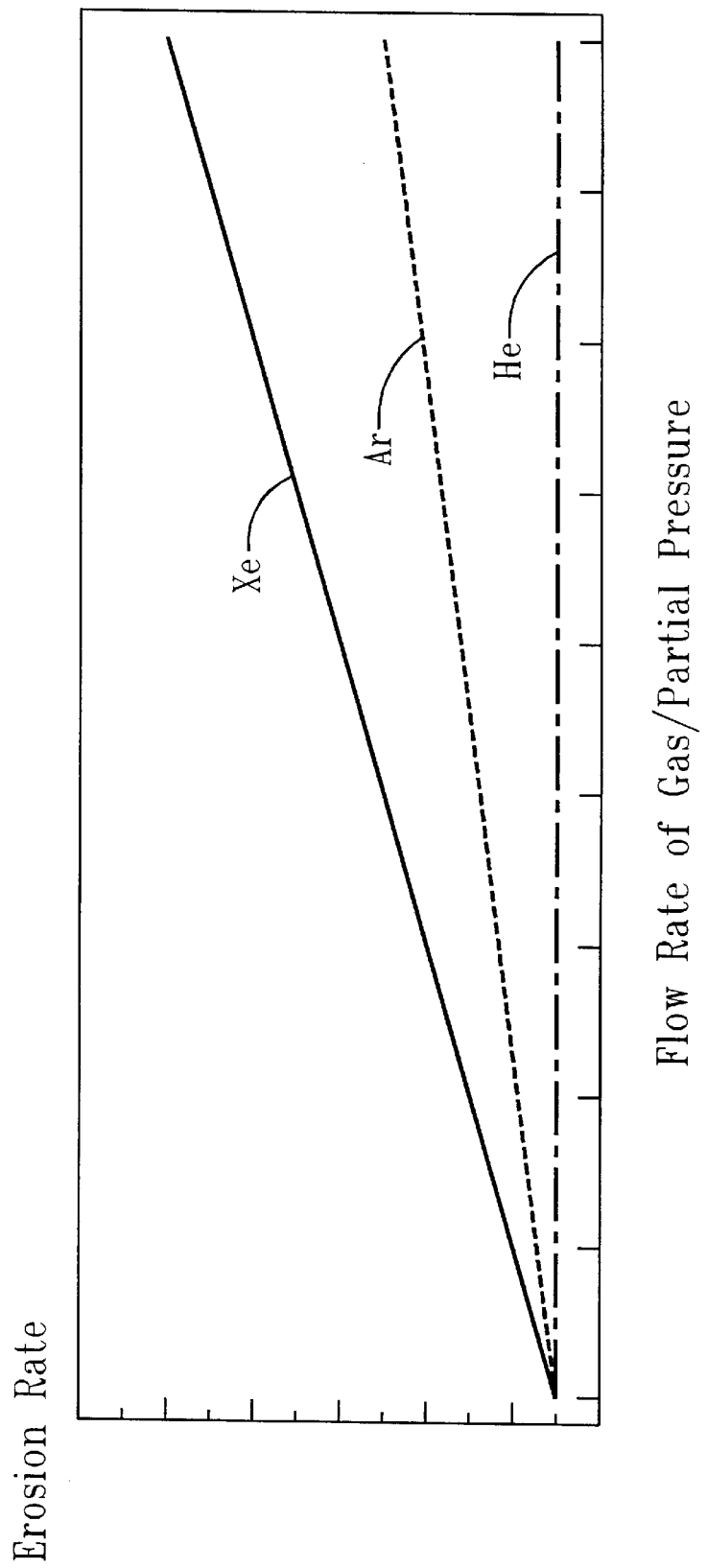
FIG. 4 represents a graph that demonstrates changes in erosion rate with respect to gas flow rate.

FIG. 4 shows the effects of sputter gas atomic weight on erosion rate. As can be seen in FIG. 4, as the mass of the sputter gas increases, the erosion rate increases. On the other hand, smaller species result in a decreased erosion rate. For example, xenon produced the greatest erosion rate. On the other hand, helium, the smallest of the three species shown produced almost no erosion. Argon, the intermediate species produced an erosion rate in between xenon and helium.

FIG. 4 demonstrates selection criteria that may be used to determine the material introduced into the apparatus to sputter and, hence, the material desired to be implanted. For example, species with similar molecular weights or integer multiples to the species to be implanted should be avoided. Additionally, if no electric impact is desired because species are being implanted into silicon. Therefore, an inactive species should be chosen.

According to the present invention, the high sputter-yield inert gas, coupled with a high arc current such as up to about 100 amps and applied bias voltage of about 5–10 volts, increases the sputter rate of tungsten away from the filament. Introducing a reactant that forms volatile high-temperature tungsten compounds has the same result. By properly proportioning the fluorine containing gas, the high sputter yield inert gas, and the arc current, simultaneous erosion and deposition of tungsten onto the filament would take place, resulting in little or no net change in filament size.

In a similar manner, a fluorine containing gas, such as $CF_4$, $BF_3$, $F_2$, $NF_3$, $GeF_4$, $SiF_4$ or $SF_6$ could be introduced into the source chamber in a controlled manner when using a non-fluorinated primary source material. In this case the fluorine would scavenge tungsten which had been sputtered away from the filament, re-depositing it on the filament.

In the case of a reaction chamber that did not include tungsten on its walls (such as when Mo is used as a construction material), a sacrificial tungsten block could be provided in the chamber to supply the source of tungsten needed to compensate for the tungsten erosion of the filament and tungsten lost from the source cavity to the rest of the implanter apparatus.

The preferred counteracting gas materials are gaseous species, such as $CF_4$, $NF_3$, Xe, Ar, Kr, $H_2$, $BF_3$, that do not contain a low-vapor pressure subcomponent. This prevents source life degradation that would result from excessive build up of nonvolatile byproducts.

Gaseous species, such as $NF_3$, $F_2$, and $H_2$, contain no low vapor pressure subcomponents. Such species may prevent source lifetime degradation caused by deposition of As or P in the source itself.

The ions generated from the counteracting gas species can be excluded from being implanted into the semiconductor wafer or product by the mass/charge analyzer component that is present in the implanter. Such is typically a magnetic analyzer that separates the desired ions from any of the unwanted ions on the basis of mass/charge and focuses the ion beam. The arc current can be changed to alter the erosion rate. In particular, an increase in arc current causes a commensurate increase in sputtering rate and therefore erosion increases.

A further potential advantage of the additional fluorine provided by the counteracting gas is that it may also reduce the possibility for depositing tungsten on the installators, thereby causing arcing or shorts. In particular, the filament is electrically insulated from the arc chamber using electrical insulators. These insulators are typically made of high temperature ceramic materials, such as alumina or boron nitride, that will withstand high temperatures and the corrosion atmosphere generated by the precursor gas species.

Even a very thin conductive coating may short circuit the arc supply and interfere with the stability of the ion beam emitted from the source chamber, eventually rendering it unusable. At this point, the chamber must be cleaned and the insulators and filament reconditioned or replaced. Similar electrical insulators are employed to insulate the source from the extraction electrode and the source from the body of the tool.

According to a preferred aspect of the present invention, the flow of the counteracting gas is controlled through a feedback loop. The feedback loop preferably utilizes source parameters monitored on the implanter. The resistance of the source filament can be calculated from the filament voltage and current. In turn, the counteracting gas flow may be adjusted based on the resistance of the filament.

According to one embodiment, the resistance of the filament increases with decreasing diameter of the filament. In this situation, the flow of counteracting gas may be increased to result in the deposition of additional tungsten on the filament. The resistance would then decrease accordingly. One skilled in the art, once aware of the present disclosure, could determine effective flow rates of counteracting gas without undue experimentation.

Parameters that may be utilized to control processes according to the present invention include resistance, filament/arc current and/or filament/arc voltage. Filament current is a function of resistance or voltage. In addition to resistance, filament/arc voltage and/or filament/arc current, other parameters that could be utilized in control methods according to the present invention include physical filament dimension and/or filament surface area. However, neither of these parameters may be practical since they typically require disassembling the apparatus or making measurements from a photograph.

The counteracting gas could be engineered to result in no change in actual implanted material. The ion implanter preferably includes a mass/charge analyzer that would prevent implantation into the product of undesirable species.

The present invention results in extending the life of the source filament without having to fine-tune the product loading on the implanters. In addition, the present invention results in greater tool throughput and lower operating costs due to decreased maintenance requirements.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A method for controlling the implantation of ions into a target, said method comprising:

a) providing an ion source chamber having a filament for causing evolution of the ions to be implanted;

b) providing an ion source reactant gas for providing a source of the ion species to be implanted;

c) providing a counteracting gas to counter chemical transport from or to the filament depending on the reaction between the ion source gas ions and the filament and to compensate for said reaction;

d) introducing the ion source reactant into the ion source chamber;

e) measuring parameters regarding electrical characteristics of the filament;

f) introducing the counteracting gas based upon said measured parameters, wherein the counteracting gas forms ions to compensate for removal or deposition of material on said filament; and g) extracting the ions to be implanted from said ion source chamber and directing them to said target.

2. The method according to claim 1, wherein the parameters regarding electrical characteristics of said filament include voltage across and current through said filament, said method further comprising the steps of:

calculating resistivity of said filament based upon said measured voltage and current; and changing flow of said counteracting gas as said resistivity increases.

3. The method according to claim 1, wherein said flow of said counteracting gas is adjusted to result in no change in implanted material.

4. The method according to claim 1, wherein said filament is a tungsten-containing filament.

5. The method according to claim 1, wherein said ion source chamber includes walls made of tungsten-containing material.

6. The method according to claim 1, wherein said ion source chamber includes walls constructed of a metal other than a tungsten-containing material and wherein said ion source chamber further includes a sacrificial source of a tungsten containing material.

7. The method according to claim 1, wherein said ion source reactant gas is a fluoride or hydride.

8. The method according to claim 7, wherein when said ion source reactant gas includes a fluoride-containing compound, said counteracting gas includes a hydrogen-containing compound, and when said ion source reacting gas does not include a fluorine-containing compound, said counteracting gas includes a fluorine-containing compound.

9. The method according to claim 1, wherein said target is a semiconductor wafer.

10. The method according to claim 1, wherein said ion source reactant gas includes at least one member selected from the group consisting of $BF_3$ and $GeF_4$.

11. The method according to claim 10, wherein said counteracting gas includes at least one member selected from the group consisting of arsine, phosphine and $H_2$.

12. The method according to claim 1, wherein said counteracting gas includes at least one member selected from the group consisting of arsine, phosphine and $H_2$.

13. The method according to claim 1, wherein said ion source reactant gas includes at least one member selected from the group consisting of arsine and phosphine.

14. The method according to claim 13, wherein said counteracting gas includes at least one member selected from the group consisting of $BF_3$, $NF_3$, $CF_4$, $F_2$, $GeF_4$, $SiF_4$ and $SF$.

15. The method according to claim 1, wherein said counteracting gas compensates for deposition of material in said filament by sputtering deposited material from said filament.

16. The method according to claim 14, wherein said counteracting gas is an inert gas.

17. The method according to claim 15, wherein said inert gas includes at least one member selected from the group consisting of argon, xenon and krypton.

18. The method according to claim 1, wherein current flowing through the filament is changed to increase or decrease chemical transport from or to the filament.

19. The method according to claim 4, wherein said counteracting gas is a tungsten-containing gas for changing an amount of tungsten available for transport of tungsten from or to the filament.

20. The method according to claim 5, wherein said counteracting gas is a tungsten-containing gas for changing an amount of tungsten available for transport of tungsten from or to the walls made of tungsten-containing material.

21. The method according to claim 19, wherein said counteracting gas is $WF_6$.

22. The method according to claim 4, wherein said counteracting gas is tungsten-containing gas for changing an amount of tungsten available for transport of tungsten from or to the filament.

23. The method according to claim 5, wherein said counteracting gas is a tungsten-containing gas for changing an amount of tungsten available for transport of tungsten from or to the walls made of tungsten-containing material.

* * * * *